(12) United States Patent
Fukumaki

(10) Patent No.: US 11,515,323 B2
(45) Date of Patent: Nov. 29, 2022

(54) SEMICONDUCTOR DEVICE AND METHOD OF MANUFACTURING THE SAME

(71) Applicant: Kioxia Corporation, Tokyo (JP)

(72) Inventor: Naomi Fukumaki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 98 days.

(21) Appl. No.: 17/115,874

(22) Filed: Dec. 9, 2020

(65) Prior Publication Data

US 2021/0296348 A1    Sep. 23, 2021

(30) Foreign Application Priority Data

Mar. 18, 2020   (JP) .............................. JP2020-048182

(51) Int. Cl.
| | |
|---|---|
| *H01L 27/11578* | (2017.01) |
| *H01L 27/11568* | (2017.01) |
| *H01L 23/522* | (2006.01) |
| *H01L 21/321* | (2006.01) |
| *H01L 21/02* | (2006.01) |
| *H01L 21/20* | (2006.01) |

(52) U.S. Cl.
CPC .. *H01L 27/11578* (2013.01); *H01L 21/02019* (2013.01); *H01L 21/0223* (2013.01); *H01L 21/3212* (2013.01); *H01L 23/5226* (2013.01); *H01L 27/11568* (2013.01); *H01L 21/2022* (2013.01)

(58) Field of Classification Search
CPC ............ H01L 21/02019; H01L 21/0223; H01L 21/3212; H01L 21/2022; H01L 27/11578; H01L 27/11568; H01L 27/11582; H01L 23/5226
See application file for complete search history.

(56) References Cited

U.S. PATENT DOCUMENTS

| | | | |
|---|---|---|---|
| 8,013,383 B2 | 9/2011 | Kidoh et al. | |
| 8,455,940 B2 | 6/2013 | Lee et al. | |
| 9,130,054 B2 | 9/2015 | Jang et al. | |
| 9,620,512 B1* | 4/2017 | Nishikawa | ........ H01L 27/11531 |
| 10,283,513 B1* | 5/2019 | Zhou | ................ H01L 27/11565 |
| 10,396,092 B2 | 8/2019 | Kanamori et al. | |
| 2015/0076586 A1* | 3/2015 | Rabkin | .............. G11C 16/0483 257/324 |
| 2019/0326316 A1 | 10/2019 | Son et al. | |
| 2020/0135759 A1* | 4/2020 | Choi | ................ H01L 27/11568 |
| 2020/0303390 A1* | 9/2020 | Park | .................... H01L 29/4234 |

\* cited by examiner

*Primary Examiner* — Galina G Yushina

(74) *Attorney, Agent, or Firm* — Oblon, McClelland, Maier & Neustadt, L.L.P.

(57) ABSTRACT

In one embodiment, a semiconductor device includes a stacked film alternately including a plurality of electrode layers and a plurality of insulating layers. The device further includes a first insulator, a charge storage layer, a second insulator and a first semiconductor layer that are disposed in order in the stacked film. The device further includes a plurality of first films disposed between the first insulator and the plurality of insulating layers. Furthermore, at least one of the first films includes a second semiconductor layer.

12 Claims, 13 Drawing Sheets

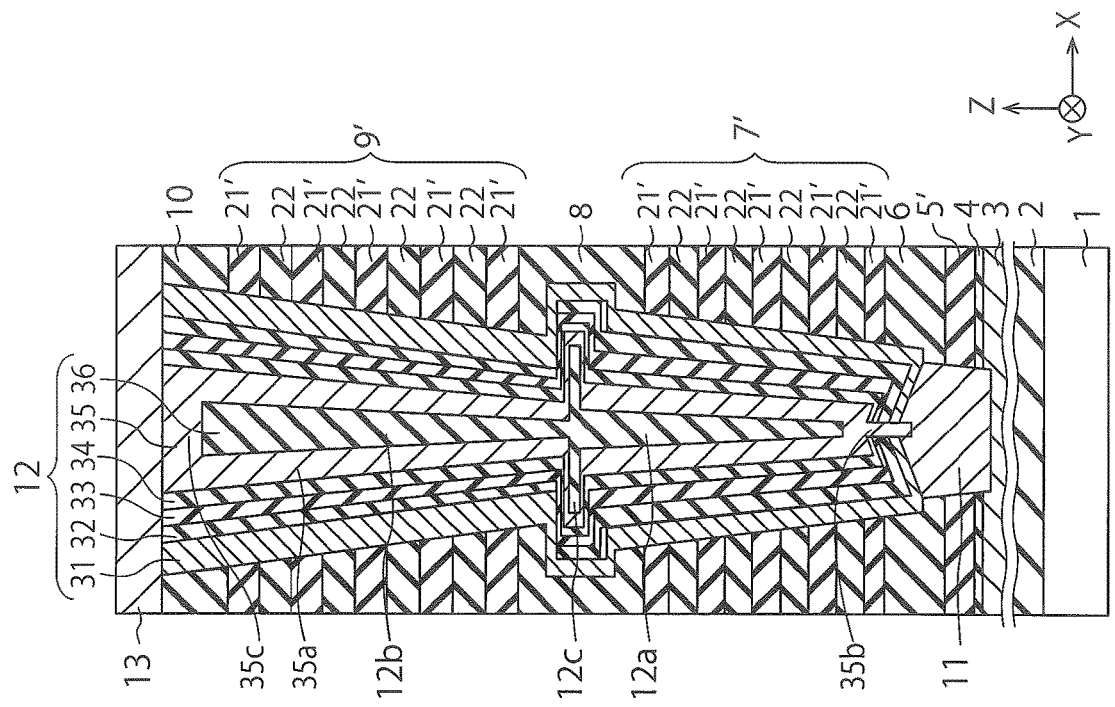
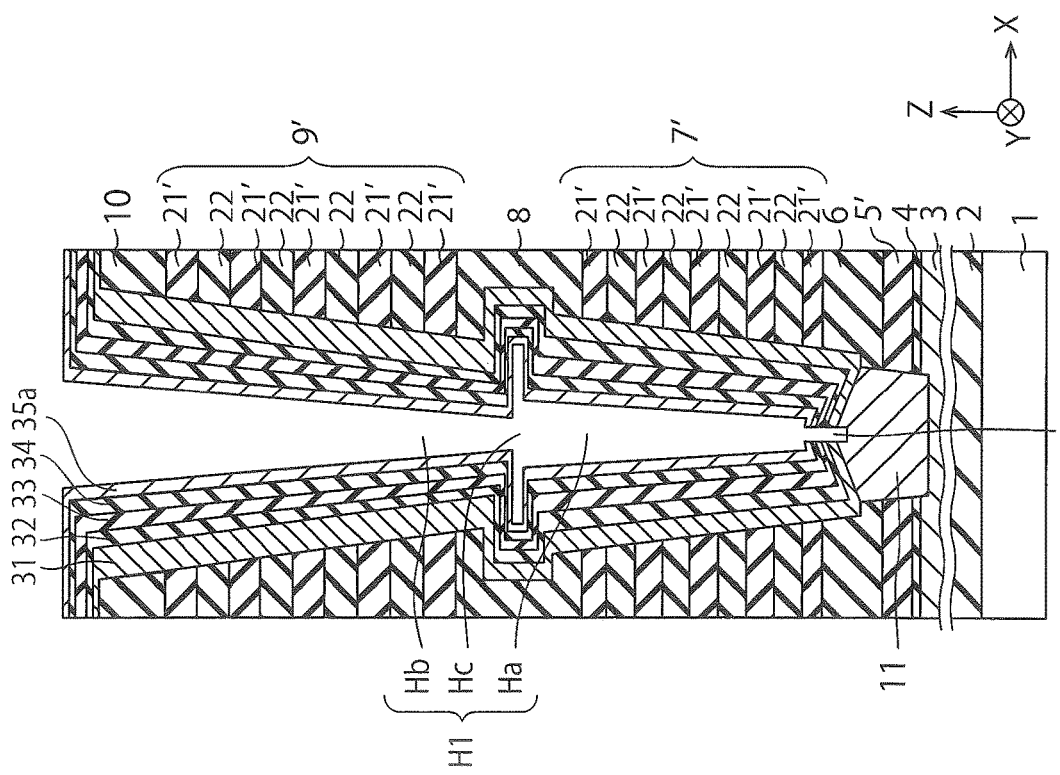
FIG. 4A
FIG. 4B

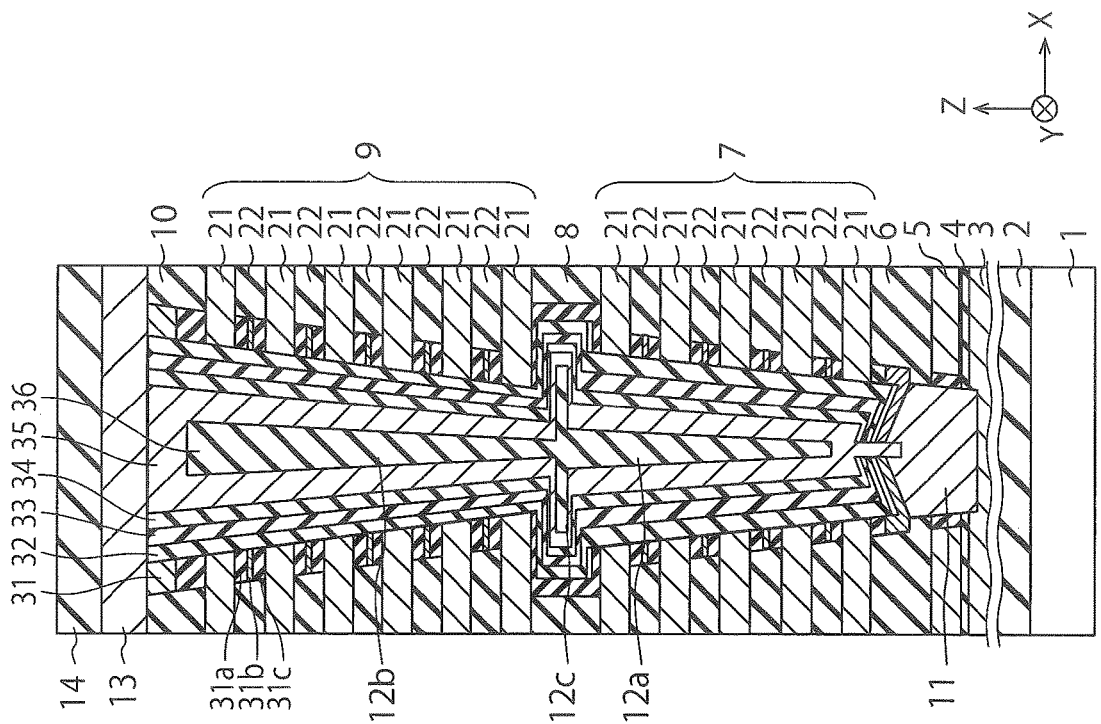
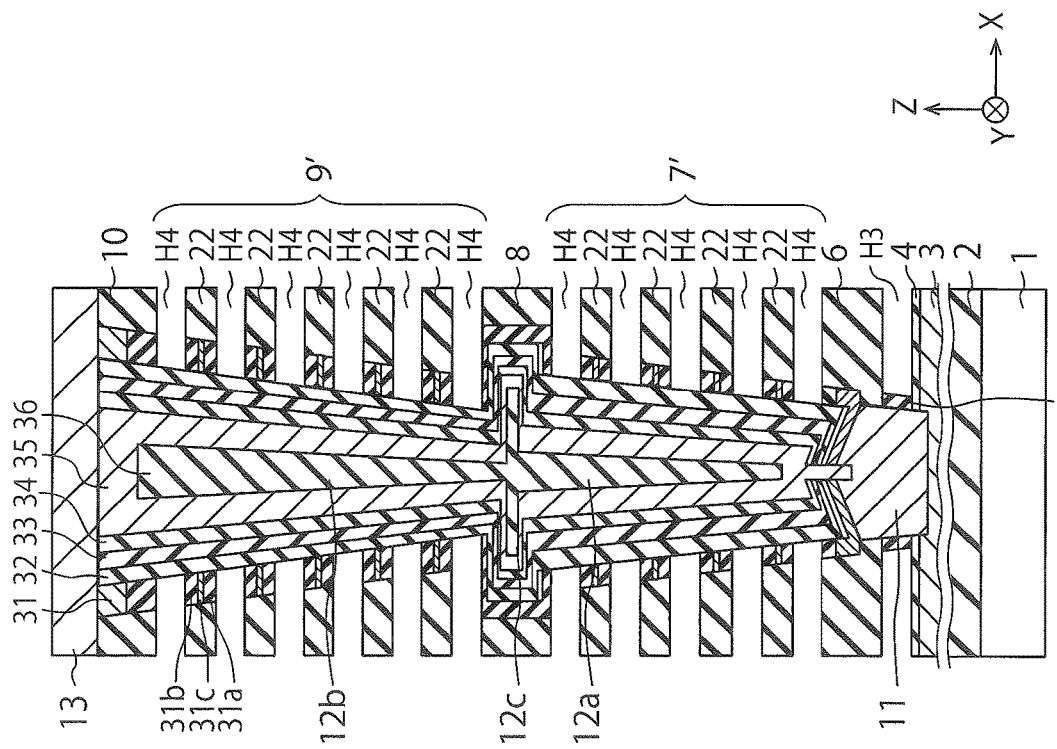

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2020-048182, filed on Mar. 18, 2020, the entire contents of which are incorporated herein by reference.

FIELD

Embodiments described herein relate to a semiconductor device and a method of manufacturing the same.

BACKGROUND

In a case where a diameter of a memory hole in an upper portion of the memory hole is significantly different from that in a lower portion of the memory hole, it may cause various problems such as a failure in embedding an electrode layer or a void in an insulator.

BRIEF DESCRIPTION OF THE DRAWINGS

FIGS. 3A to 6B are cross-sectional views of a method of manufacturing the semiconductor device of the first embodiment;

DETAILED DESCRIPTION

Figure 1:
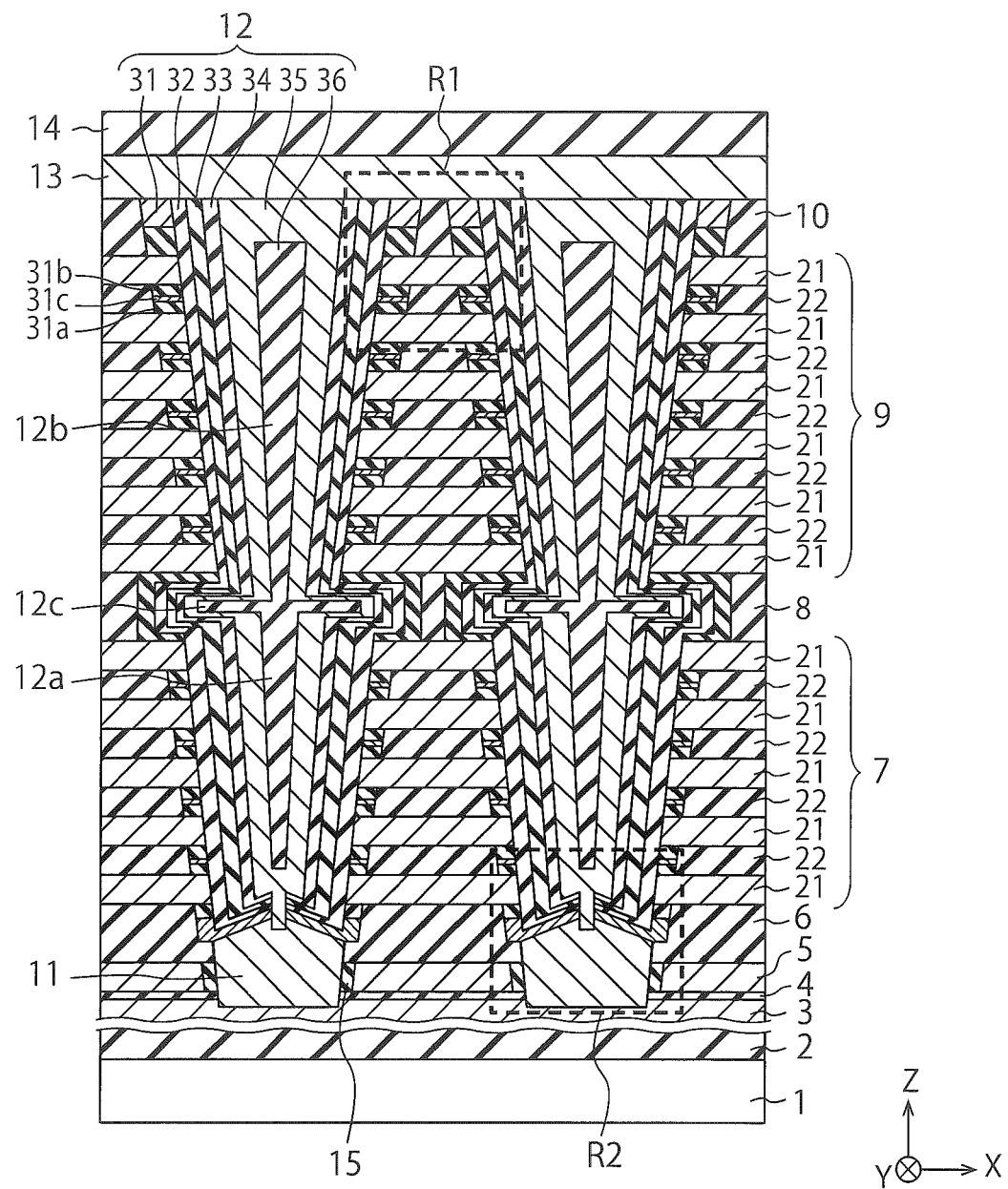
FIG. 1 is a cross-sectional view of a structure of a semiconductor device of a first embodiment.

Embodiments will now be explained with reference to the accompanying drawings. Throughout FIGS. 1 to 13B, the same component is denoted by the same reference numeral, and an overlapping explanation thereof will be omitted.

In one embodiment, a semiconductor device includes a stacked film alternately including a plurality of electrode layers and a plurality of insulating layers. The device further includes a first insulator, a charge storage layer, a second insulator and a first semiconductor layer that are disposed in order in the stacked film. The device further includes a plurality of first films disposed between the first insulator and the plurality of insulating layers. Furthermore, at least one of the first films includes a second semiconductor layer.

First Embodiment

FIG. 1 is a cross-sectional view of a structure of a semiconductor device of a first embodiment. The semiconductor device in FIG. 1 is a three-dimensional memory, for example.

The semiconductor device in FIG. 1 includes a substrate 1, an inter layer dielectric 2, a source layer 3 which is an example of the third interconnect layer, an inter layer dielectric 4, a gate layer 5 which is an example of the second interconnect layer, an inter layer dielectric 6, a lower stacked film 7, an inter layer dielectric 8, an upper stacked film 9, an inter layer dielectric 10, a plurality of semiconductor layers 11 each of which is an example of the third semiconductor layer, a plurality of columnar portions 12, a drain layer 13 which is an example of the first interconnect layer, an inter layer dielectric 14, and a plurality of insulators 15 each of which is an example of the fifth insulator. Each of the lower stacked film 7 and the upper stacked film 9 is an example of the stacked film. The columnar portions 12 each include a lower columnar section 12a, an upper columnar section 12b, and an intermediate section 12c.

The lower stacked film 7 alternately includes a plurality of electrode layers 21 and a plurality of insulating layers 22. Similarly, the upper stacked film 9 alternately includes a plurality of the electrode layers 21 and a plurality of the insulating layers 22. The columnar portions 12 each include a plurality of spacer films 31 which is an example of the plurality of first films, a block insulator 32 which is an example of the first insulator, a charge storage layer 33, a tunnel insulator 34 which is an example of the second insulator, a channel semiconductor layer 35 which is an example of the first semiconductor layer, and a core insulator 36, in order. Most of the spacer films 31 each include an insulator 31a which is an example of the third insulator, an insulator 31b which is an example of the fourth insulator, and a semiconductor layer 31c which is an example of the second semiconductor layer.

The substrate 1 is a semiconductor substrate such as a silicon substrate, for example. FIG. 1 shows an X direction and a Y direction that are parallel with a surface of the substrate 1 and are perpendicular to each other, and shows a Z direction that is perpendicular to the surface of the substrate 1. Here, the +Z direction is regarded as an upward direction, and the −Z direction is regarded as a downward direction. The −Z direction may match the gravity direction, or may not match the gravity direction.

The inter layer dielectric 2, the source layer 3, the inter layer dielectric 4, the gate layer 5, and the inter layer dielectric 6 are formed in order on the substrate 1. The inter layer dielectric 2 is a silicon oxide film, for example. The source layer 3 is a stacked film including a metal layer and a semiconductor layer, for example. The inter layer dielectric 4 is a silicon oxide film, for example. The gate layer 5 is a metal layer, for example. The inter layer dielectric 6 is a silicon oxide film, for example.

The lower stacked film 7 includes the plurality of electrode layers 21 and the plurality of insulating layers 22 that are alternately layered on the inter layer dielectric 6. Each of the electrode layers 21 in the lower stacked film 7 is a metal layer, for example, and functions as a word line of the three-dimensional memory. Each of the insulating layers 22 in the lower stacked film 7 is a silicon oxide film, for example. The inter layer dielectric 8 is formed on the lower stacked film 7. The inter layer dielectric 8 is a silicon oxide film, for example.

The upper stacked film 9 includes the plurality of electrode layers 21 and the plurality of insulating layers 22 that are alternately layered on the inter layer dielectric 8. Each of the electrode layers 21 in the upper stacked film 9 is a metal layer, for example, and functions as a word line of the three-dimensional memory. Each of the insulating layers 22 in the upper stacked film 9 is a silicon oxide film, for example. The inter layer dielectric 10 is formed on the upper stacked film 9. The inter layer dielectric 10 is a silicon oxide film, for example.

The semiconductor layers 11 are formed in the source layer 3, the inter layer dielectric 4, the gate layer 5, and the inter layer dielectric 6, and are electrically connected to the source layer 3. Each of the semiconductor layers 11 is a polysilicon layer formed by epitaxial growth, for example.

Each of the columnar portions 12 is formed in the inter layer dielectric 6, the lower stacked film 7, the inter layer dielectric 8, and the upper stacked film 9, and is disposed on the corresponding semiconductor layers 11. The columnar portions 12 each have a columnar shape extending in the Z direction. Each of the columnar portions 12 includes the lower columnar section 12a that is formed substantially in the lower stacked film 7, the upper columnar section 12b that is formed substantially in the upper stacked film 9, and the intermediate section 12c that is formed in the inter layer dielectric 8 and that connects the lower columnar section 12a to the upper columnar sections 12b.

The drain layer 13 and the inter layer dielectric 14 are formed in order on the inter layer dielectric 10 and the plurality of columnar portions 12. The drain layer 13 is a polysilicon layer, for example. The inter layer dielectric 14 is a silicon oxide film, for example.

The insulators 15 are each formed on a side surface of the corresponding semiconductor layer 11, and each have an annular shape to surround the corresponding semiconductor layer 11. Each of the insulators 15 is a silicon oxide film, for example. The gate layer 5 surrounds each of the semiconductor layers 11 via the insulators 15.

The spacer films 31 are each formed on a side surface of the corresponding insulating layer 22, and are disposed between the corresponding insulating layer 22 and the block insulator 32. Each of the spacer films 31 has an annular shape to surround the block insulator 32. The plurality of spacer films 31 included in each of the columnar portions 12 are formed by dividing one spacer film 31 into portions, as described later.

Most of the spacer films 31 each include the insulator 31a, the insulator 31b, and the semiconductor layer 31c. The insulator 31a is formed on the lower surface of the semiconductor layer 31c. The insulator 31a is a silicon oxide film, for example. The insulator 31b is formed on the upper surface of the semiconductor layer 31c. The insulator 31b is a silicon oxide film, for example. The semiconductor layer 31c is disposed between the insulator 31a and the insulator 31b. The semiconductor layer 31c is an amorphous silicon layer or a polysilicon layer, for example. As described later, each of the spacer films 31 of the present embodiment originally includes the semiconductor layer 31c only, and the insulators 31a, 31b are formed by oxidizing portions of the semiconductor layer 31c.

The spacer film 31 that is disposed at the top of each of the columnar portions 12 includes the insulator 31a and the semiconductor layer 31c only. In addition, the spacer film 31 that is disposed at the bottom of each of the columnar portions 12 includes the insulator 31b and the semiconductor layer 31c only.

The block insulator 32, the charge storage layer 33, the tunnel insulator 34, the channel semiconductor layer 35, and the core insulator 36 are formed on side surfaces of the inter layer dielectric 6, the lower stacked film 7, the inter layer dielectric 8, and the upper stacked film 9 via the plurality of spacer films 31. The block insulator 32 is a silicon oxide film, for example. The charge storage layer 33 is a silicon nitride film, for example. The tunnel insulator 34 is a silicon oxide film, for example. The channel semiconductor layer 35 is a polysilicon layer, for example. The channel semiconductor layer 35 is in contact with the corresponding semiconductor layer 11, and is electrically connected to the source layer 3 via the semiconductor layer 11. The channel semiconductor layer 35 is further in contact with the drain layer 13, and is electrically connected to the drain layer 13. The core insulator 36 is a silicon oxide film, for example.

Figure 2A:
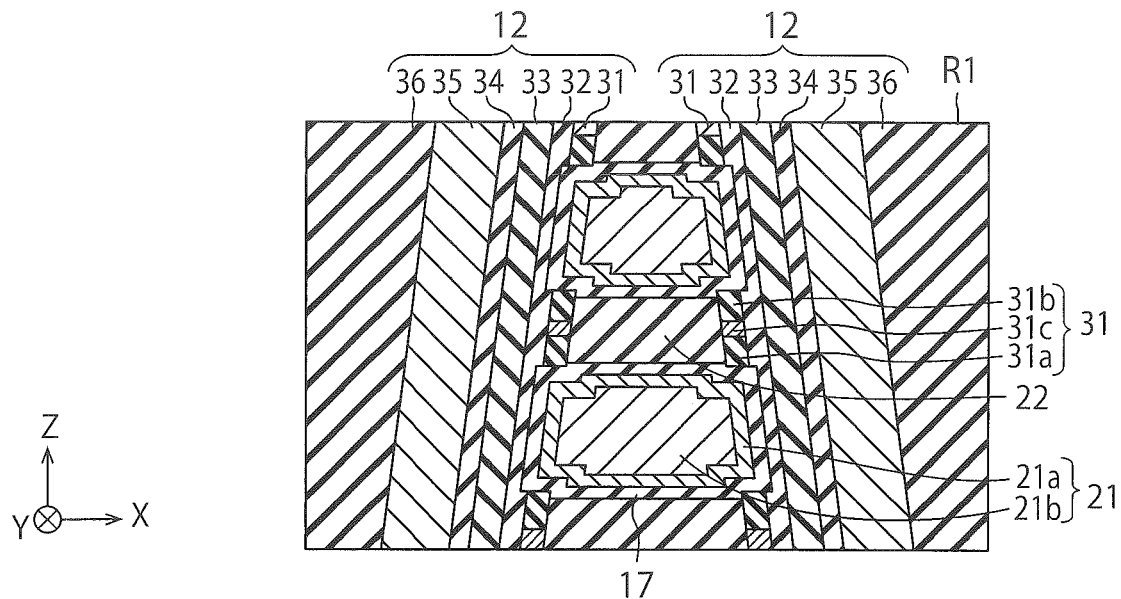
FIGS. 2A and 2B are enlarged cross-sectional views of the structure of the semiconductor device of the first embodiment.
Figure 2B:
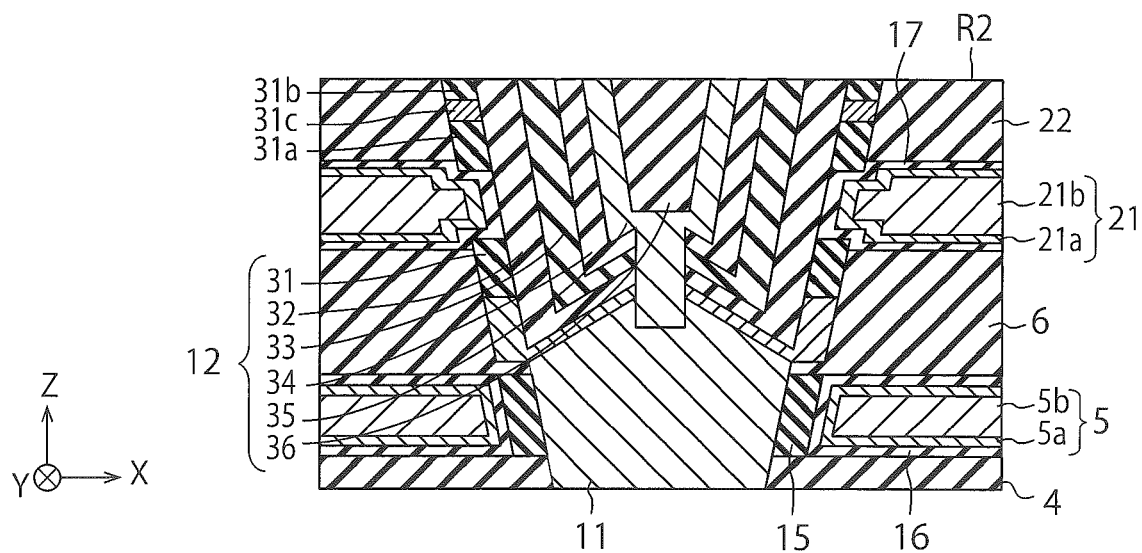

FIGS. 2A and 2B are enlarged cross-sectional views of the structure of the semiconductor device of the first embodiment. FIG. 2A illustrates a region R1 illustrated in FIG. 1 in an enlarged manner. FIG. 2B illustrates a region R2 illustrated in FIG. 1 in an enlarged manner.

As illustrated in FIG. 2B, the gate layer 5 of the present embodiment is formed, via an insulator 16, on the upper surface of the inter layer dielectric 4, on the lower surface of the inter layer dielectric 6, and on a side surface of the insulators 15. The insulator 16 is a metallic insulator such as an $Al_2O_3$ film (aluminum oxide film), for example. The gate layer 5 of the present embodiment includes a barrier metal layer 5a and an electrode material layer 5b formed in order on a surface of the insulator 16. The barrier metal layer 5a is a TiN film (titanium nitride film), for example. The electrode material layer 5b is a W (tungsten) layer, for example.

As illustrated in FIGS. 2A and 2B, the electrode layers 21 of the present embodiment are formed on upper surfaces of the insulating layers 22, etc., on lower surfaces of the insulating layers 22, etc., and on a side surface of the block insulator 32 via an insulator 17. The insulator 16 is a metallic insulator such as an $Al_2O_3$ film, for example. The insulator 16 of the present embodiment as well as the block insulator 32 functions as a block insulator of each memory cell in the three-dimensional memory. Each of the electrode layers 21 of the present embodiment includes a barrier metal layer 21a and an electrode material layer 21b formed in order on a surface of the insulator 17. The barrier metal layer 21a is a TiN film, for example. The electrode material layer 21b is a W layer, for example.

FIGS. 2A and 2B further illustrate the insulator 31a, the insulator 31b, and the semiconductor layer 31c in each of the spacer films 31. As described later, each of the spacer films 31 of the present embodiment originally includes the semiconductor layer 31c only, and the insulators 31a, 31b are formed by oxidizing portions of the semiconductor layer 31c. In the present embodiment, while each of the spacer films 31 includes the semiconductor layer 31c only, the width, in the Z direction, of each of the spacer films 31 is substantially equal to the thickness (i.e., the width in the Z direction) of each of the insulating layers 22. However, the width, in the Z direction, of each of the spacer films 31 illustrated in FIGS. 2A and 2B is larger than the thickness of each of the insulating layers 22 because each of the spacer films 31 expands upon oxidization of the semiconductor layer 31c. The width, in the Z direction, of each of the spacer films 31 is equivalent to the width, in the thickness direction of the insulating layers 22, of each of the spacer films 31.

FIGS. 3A to 6B are cross-sectional views of a method of manufacturing the semiconductor device of the first embodiment.

Figure 3B:
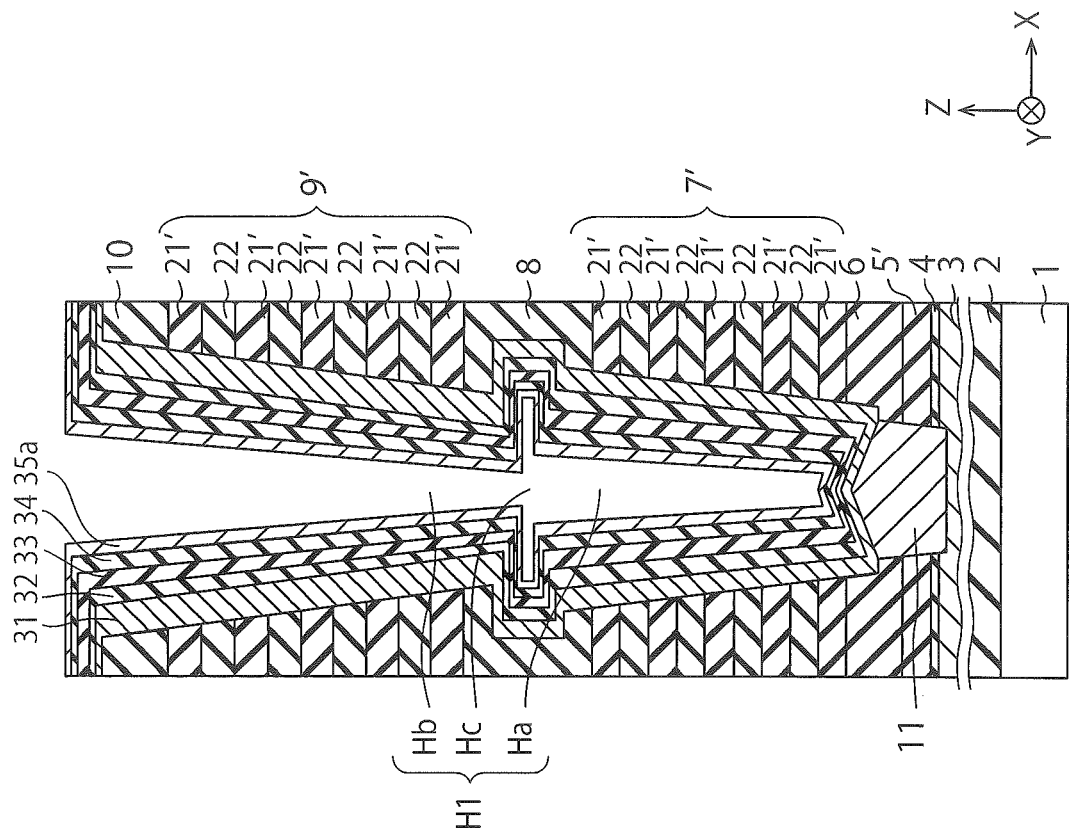
Figure 3A:
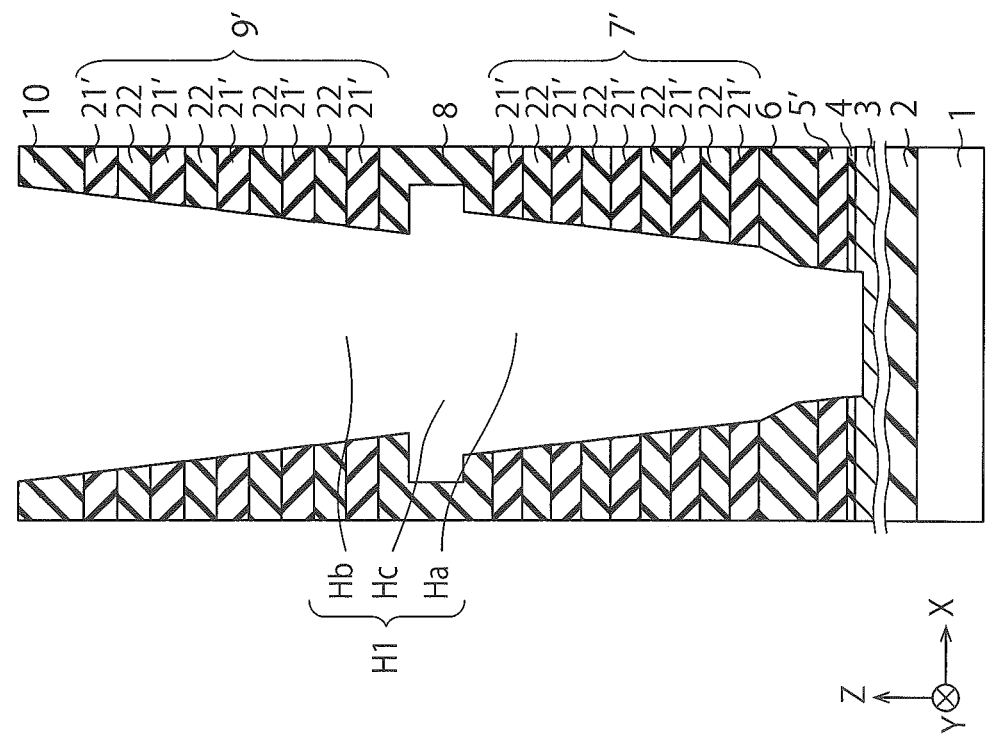

First, the inter layer dielectric 2, the source layer 3, the inter layer dielectric 4, a sacrifice layer 5', the inter layer dielectric 6, a lower stacked film 7', the inter layer dielectric 8, an upper stacked film 9', and the inter layer dielectric 10 are formed in order on the substrate 1 (FIG. 3A). The sacrifice layer 5' is a silicon nitride film, for example. The lower stacked film 7' is formed so as to alternately include a plurality of sacrifice layers 21' and the plurality of insulating layers 22. Similarly, the upper stacked film 9' is formed so as to alternately include the plurality of sacrifice layers 21' and the plurality of insulating layers 22. Each of the sacrifice layers 21' in the lower stacked film 7' and the upper stacked film 9' is a silicon nitride film, for example. Each of the sacrifice layers 21' is an example of the first insulating layer. Each of the insulating layers 22 is an example of the second insulating layer.

Next, a plurality of memory holes H1 are formed in the inter layer dielectric 10, the upper stacked film 9', the inter layer dielectric 8, the lower stacked film 7', the inter layer dielectric 6, the sacrifice layer 5', the inter layer dielectric 4, and the source layer 3 (FIG. 3A). FIG. 3A illustrates one of the memory holes H1. The memory holes H1 of the present embodiment each include a lower memory hole Ha that is formed substantially in the lower stacked film 7', an upper memory hole Hb that is formed substantially in the upper stacked film 9', and an intermediate open section Hc that is formed in the inter layer dielectric 8 and that connects the lower memory hole Ha to the upper memory hole Hb. Each of the memory holes H1 of the present embodiment is an example of the hole.

The lower memory hole Ha of the present embodiment has a large aspect ratio which is the ratio of a depth and a diameter. Therefore, when the lower memory hole Ha is deeper, etching process of the lower memory hole Ha becomes more difficult. For this reason, the diameter of the lower memory hole Ha of the present embodiment gradually decreases toward the −Z direction. For the same reason, the diameter of the upper memory hole Hb of the present embodiment gradually decreases toward the −Z direction. On the other hand, the inter layer dielectric 8 of the present embodiment is a silicon insulator, and thus, can be easily etched. For this reason, the diameter of the intermediate open section Hc is larger than the upper end diameter of the lower memory hole Ha and the lower end diameter of the upper memory hole Hb.

Next, the semiconductor layer 11 is formed in the bottom of each of the memory holes H1 (FIG. 3B). Accordingly, the semiconductor layer 11 is electrically connected to the source layer 3. Next, the spacer film 31, the block insulator 32, the charge storage layer 33, the tunnel insulator 34, and a semiconductor layer 35a for the channel semiconductor layer 35 are formed in order in each of the memory holes H1 (FIG. 3B). The spacer film 31 that is formed at the step in FIG. 3B is an amorphous silicon layer, and is not divided into portions corresponding to the insulating layers 22. The amorphous silicon layer is an example of the second semiconductor layer. In addition, the semiconductor layer 35a that is formed at the step in FIG. 3B is an amorphous silicon layer, for example.

Next, an open section H2 is formed in the bottom of the spacer film 31, the block insulator 32, the charge storage layer 33, the tunnel insulator 34, and the semiconductor layer 35a in each of the memory holes H1 (FIG. 4A). Accordingly, the semiconductor layer 11 is exposed from the open section H2.

Next, a semiconductor layer 35b for the channel semiconductor layer 35, the core insulator 36, and a semiconductor layer 35c for the channel semiconductor layer 35 are formed in order in each of the memory holes H1 (FIG. 4B). Accordingly, the channel semiconductor layer 35 including the semiconductor layers 35a, 35b, 35c is formed in each of the memory holes H1. In addition, the semiconductor layer 35b is formed in the open section H2 so that the channel semiconductor layer 35 is electrically connected to the semiconductor layer 11. The semiconductor layers 35b, 35c that are formed at the step in FIG. 4B are amorphous silicon layers, for example. In the aforementioned manner, the columnar portion 12 is formed in each of the memory holes H1. The channel semiconductor layer 35, etc. formed outside the memory hole H1 is removed by CMP (Chemical Mechanical Polishing). Next, the drain layer 13 is formed on the inter layer dielectric 10 and the columnar portion 12 (FIG. 4B). Accordingly, the drain layer 13 is electrically connected to the channel semiconductor layer 35.

In the present embodiment, after the semiconductor layers 35a, 35b, 35c are formed, crystallization annealing is performed on the semiconductor layers 35a, 35b, 35c. Accordingly, the semiconductor layers 35a, 35b, 35c which are amorphous silicon layers are converted to polysilicon layers. At the same time, the amorphous silicon layer in the spacer film 31 may also be converted to a polysilicon layer.

Figure 5A:
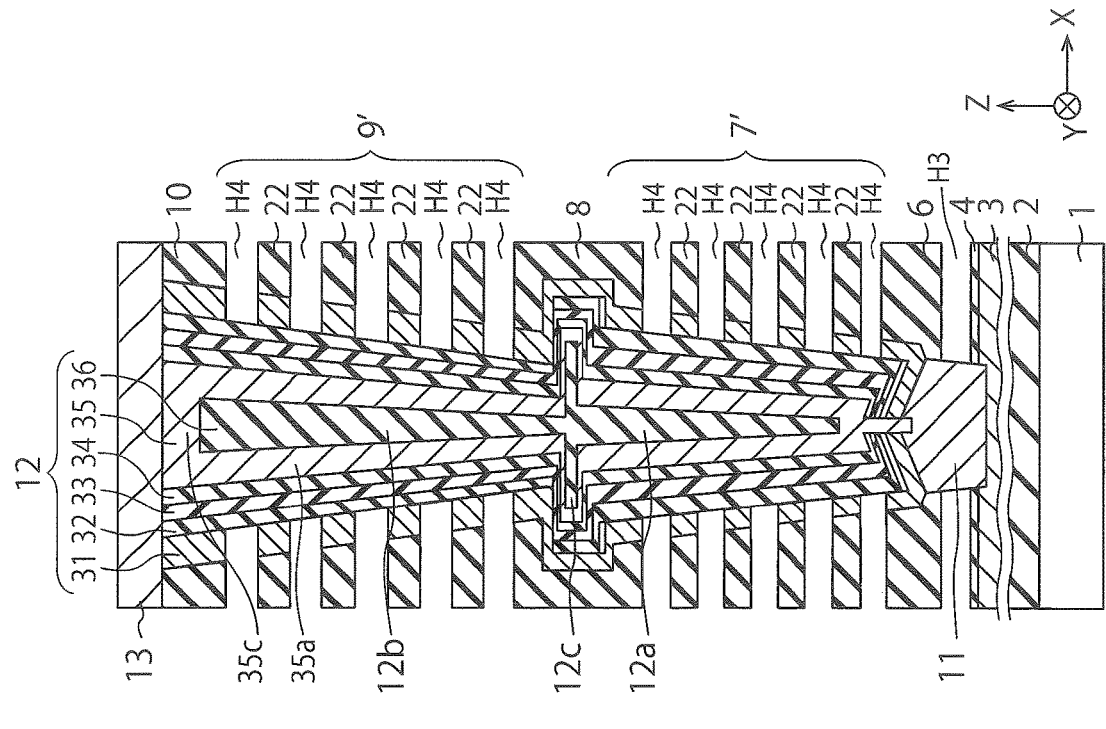

Next, a slit (not illustrated) passing through the drain layer 13, the inter layer dielectric 10, the upper stacked film 9', the inter layer dielectric 8, and the lower stacked film 7' is formed, and phosphoric acid is used to remove the sacrifice layers 5', 21' through the slit (FIG. 5A). As a result, a cavity H3 is formed in a region where the sacrifice layer 5' has been removed, and a plurality of cavities H4 are formed in a region where the plurality of sacrifice layers 21' have been removed. The cavities H4 are an example of the concave portions.

Figure 5B:
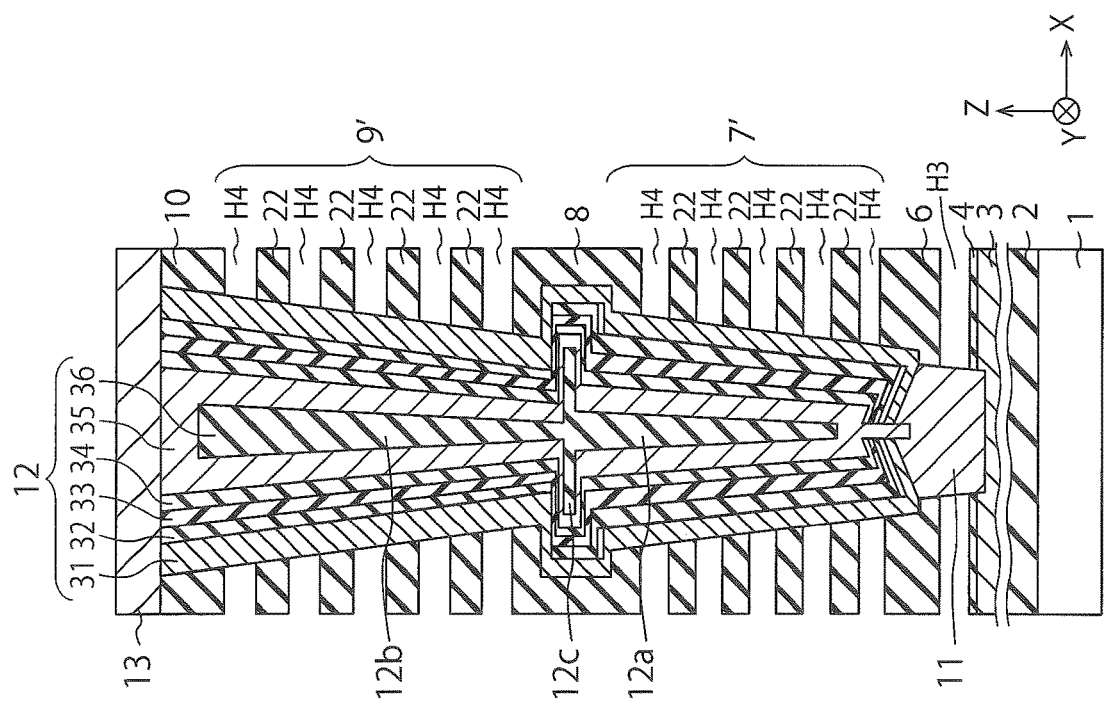

Next, phosphoric acid is used to remove portions of the spacer film 31 through the cavities H4 (FIG. 5B). Specifically, portions of the spacer film 31 located between the cavities H4 and the block insulator 32 are removed so that a side surface of the block insulator 32 is exposed from the cavities H4. As a result, the spacer film 31 is divided into portions corresponding to the insulating layers 22. FIG. 5B illustrates the plurality of spacer films 31 remaining between the plurality of insulating layers 22 and the block insulator 32.

In FIG. 5B, the width, in the Z direction, of each of the spacer films 31 is substantially equal to the thickness (i.e., the width in the Z direction) of each of the insulating layers 22. The width, in the Z direction, of each of the spacer films 31 may become thinner than the thickness of each of the insulating layers 22 as a result of overetching of the spacer films 31 at the step in FIG. 5B.

Next, surfaces (lower surfaces and upper surfaces) of the spacer films 31 are oxidized by use of the cavities H4 (FIG. 6A). As a result, the insulator 31a and the insulator 31b are respectively formed near the lower surface and near the upper surface of each of the spacer films 31, and the semiconductor layer 31c remains between the insulator 31a and the insulator 31b of each of the spacer films 31. The semiconductor layer 31c is an amorphous silicon layer or a polysilicon layer, for example. The insulators 31a, 31b are silicon oxide films, for example. In the present embodiment, as a result of oxidization of the surfaces of the spacer films 31, the width, in the Z direction, of each of the spacer films 31 becomes larger than the thickness of each of the insulating layers 22 (see FIGS. 2A and 2B). Next, the insulator 15 is formed on a side surface of the semiconductor layer 11 in the cavity H3 (FIG. 6A).

In FIG. 6A, the spacer film 31 that is disposed at the top of each of the columnar portions 12 includes the insulator 31a and the semiconductor layer 31c only. In addition, the spacer film 31 that is disposed at the bottom of each of the columnar portions 12 includes the insulator 31b and the semiconductor layer 31c only.

Next, the insulator 16 (not illustrated) and the gate layer 5 are formed in order in the cavity H3, and the insulator 17 (not illustrated) and the electrode layer 21 are formed in order in each of the cavities H4 (FIG. 6B). As previously described with reference to FIGS. 2A and 2B, the gate layer 5 is formed so as to include the barrier metal layer 5a and the electrode material layer 5b in order, and the electrode layers 21 are formed so as to each include the barrier metal layer 21a and the electrode material layer 21b in order. Accordingly, the lower stacked film 7 alternately including the plurality of electrode layers 21 and the plurality of insulating layers 22 is formed on the inter layer dielectric 6, and the upper stacked film 9 alternately including the plurality of electrode layers 21 and the plurality of insulating layers 22 is formed on the inter layer dielectric 8. Next, the inter layer dielectric 14 is formed on the drain layer 13 (FIG. 6B).

Thereafter, various plug layers, interconnect layers, inter layer dielectrics, etc. are formed on the substrate 1. In the manner explained so far, the semiconductor device of the present embodiment is manufactured.

Figure 7:
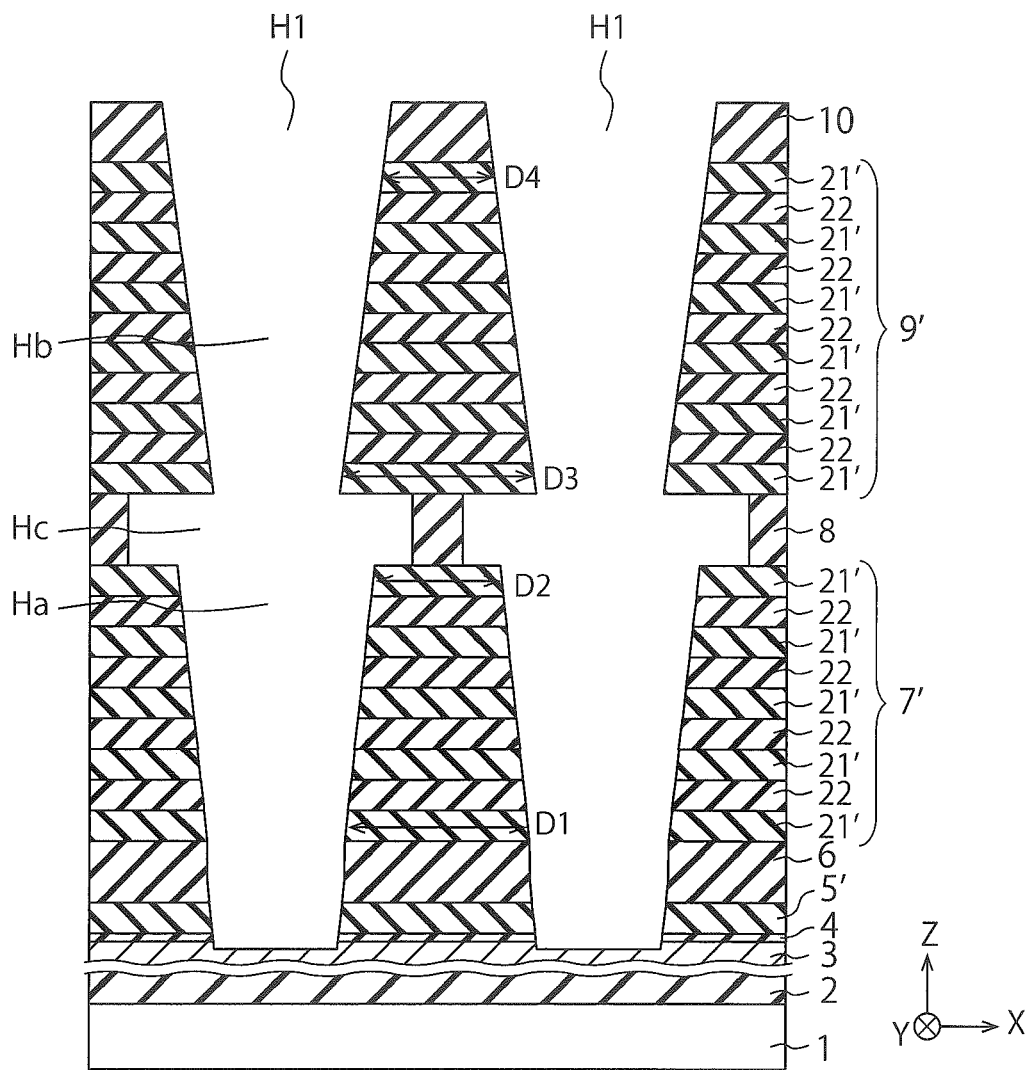
FIG. 7 is a cross-sectional view for explaining the method of manufacturing the semiconductor device of the first embodiment.

Hereinafter, the semiconductor device of the present embodiment will be explained in more detail with reference to FIGS. 1 to 6B. This explanation will be given also with reference to FIG. 7, as appropriate. FIG. 7 is a cross-sectional view for explaining a method of manufacturing the semiconductor device of the first embodiment.

FIG. 7 shows, in a cross section identical to that in FIG. 3A, a distance D1 between lower memory holes Ha in a lower portion of the lower memory holes Ha, a distance D2 between lower memory holes Ha in an upper portion of the lower memory holes Ha, a distance D3 between upper memory holes Hb in a lower portion of the upper memory holes Hb, and a distance D4 between upper memory holes Hb in an upper portion of the upper memory holes Hb.

As described previously, the lower memory holes Ha of the present embodiment each have a large aspect ratio which is the ratio of a depth and a diameter. Therefore, when the lower memory holes Ha are deeper, etching process of the lower memory holes Ha becomes more difficult. For this reason, the diameter of each of the lower memory holes Ha illustrated in FIG. 7 gradually decreases toward the −Z direction. Similarly, the diameter of each of the upper memory holes Hb illustrated in FIG. 7 gradually decreases toward the −Z direction.

Consequently, the distance D2 between the lower memory holes Ha in the upper portion of the lower memory holes Ha is shorter than the distance D1 between the lower memory holes Ha in the lower portion of the lower memory holes Ha (D2<D1). Similarly, the distance D4 between the upper memory holes Hb in the upper portion of the upper memory holes Hb is shorter than the distance D3 between the upper memory holes Hb in the lower portion of the upper memory holes Hb (D4<D3).

In this case, near the upper portion of the lower memory holes Ha and near the upper portion of the upper memory holes Hb, embedding the electrode layers 21 in the cavities H4 at the step in FIG. 6B is difficult. Therefore, there is a possibility that various problems such as high resistance of the electrode layers 21, occurrence of a failure in degassing F (fluorine) due to insufficient embedding, occurrence of a $SiO_2$ void, and the like, occur in the electrode layers 21. In this case, the diameter of each of the memory holes H1 may be reduced to lengthen the distance D2 or the distance D4. However, when the diameter of each of the memory holes H1 is reduced, forming the open section H2 in the bottom of each of the memory holes H1 becomes difficult.

Therefore, in the present embodiment, the block insulator 32 is formed in each of the memory holes H1 via the spacer film 31 at the step in FIG. 3B. Next, after the spacer film 31 is removed at leading ends of the sacrifice layers 21' at the step in FIG. 5B, the electrode layers 21 are formed in the cavities H4 at the step in FIG. 6B. According to the present embodiment, as a result of removal of the spacer film 31, the volume of the cavities H4 can be made large. Accordingly, the electrode layers 21 can be easily embedded in the cavities H4 so that the aforementioned problems such as the resistance, a failure in degassing, and a void can be prevented.

Moreover, in the present embodiment, surfaces of the spacer films 31 are oxidized by use of the cavities H4 at the step in FIG. 6A. Accordingly, electrical connection among the different electrode layers 21 via the spacer films 31 can be prevented, whereby leakage current among the electrode layers 21 can be prevented. When the occupation ratio of the insulators 31a, 31b in each of the spacer films 31 is increased, the resistance against leakage among the electrode layers 21 can be improved.

Figure 8C:
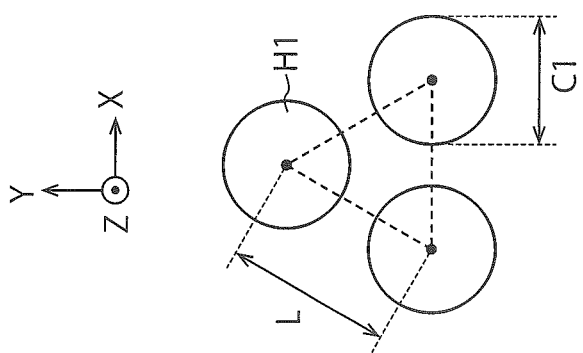
FIGS. 8A to 8C are cross-sectional views for explaining the method of manufacturing the semiconductor device of the first embodiment.
Figure 8B:
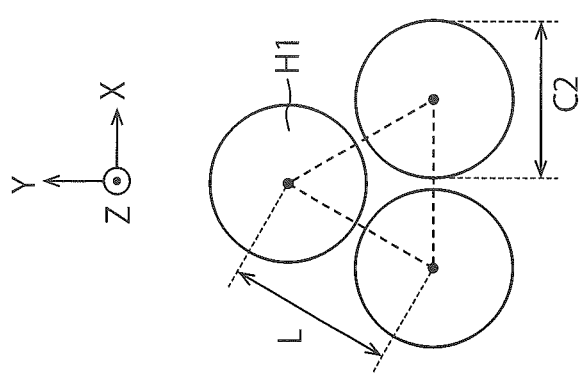
Figure 8A:
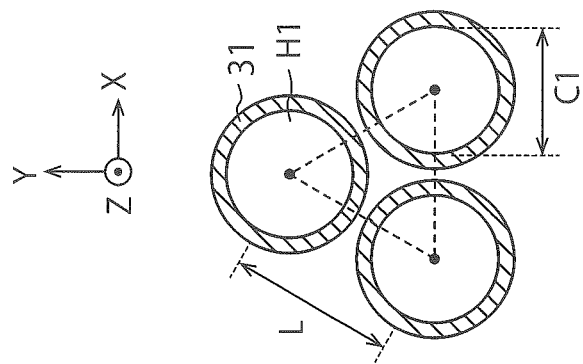

FIGS. 8A to 8C are cross-sectional views for explaining the method of manufacturing the semiconductor device of the present embodiment.

FIG. 8A shows an XY cross section including three memory holes H1. Reference character L denotes a pitch between the memory holes H1. Reference character C1 denotes the diameter of each of the memory holes H1 in the XY cross section.

FIG. 8B illustrates the same XY cross section of the three memory holes H1. The diameter of each of the memory holes H1 in the XY cross section is increased from C1 to C2. This shows a case where a design value of the diameter of each of the memory holes H1 is set to C1 but the measured value of the diameter of each of the memory holes H1 is C2. That is, FIG. 8B illustrates a case where the diameter of each of the memory holes H1 is larger than the design value C1 by "C2−C1".

In the present embodiment, after the memory holes H1 are formed at the step in FIG. 3A, the diameter of each of the memory holes H1 is measured. Then, the thickness of the spacer film 31 that is formed at the step in FIG. 3B is adjusted in accordance with the measured value of the diameter of the memory hole H1. For example, in a case where a design value of the diameter of the memory hole H1 and the measured value of the diameter of the memory hole H1 are C1 and C2, respectively, the thickness of the spacer film 31 is set to (C2−C1)/2. Accordingly, the block insulator 32, etc. can be formed such that the size thereof is equal to that in a case where the diameter of the memory hole H1 matches the design value C1 (FIG. 8C). In FIG. 8C, the inner diameter of the spacer film 31 is set to C1. Therefore, the spacer film 31 of the present embodiment may be used for correcting an error in the diameter of the memory hole H1. Accordingly, resistance variation among the electrode layers 21 can be prevented, for example.

As described so far, the block insulator 32 is formed in each of the memory holes H1 via the spacer films 31 in the present embodiment. Consequently, according to the present embodiment, problems caused by the shapes of the memory holes H1, such as the aforementioned problems of the resistance, a failure in degassing, a void, etc. can be prevented.

Second Embodiment

Figure 9:
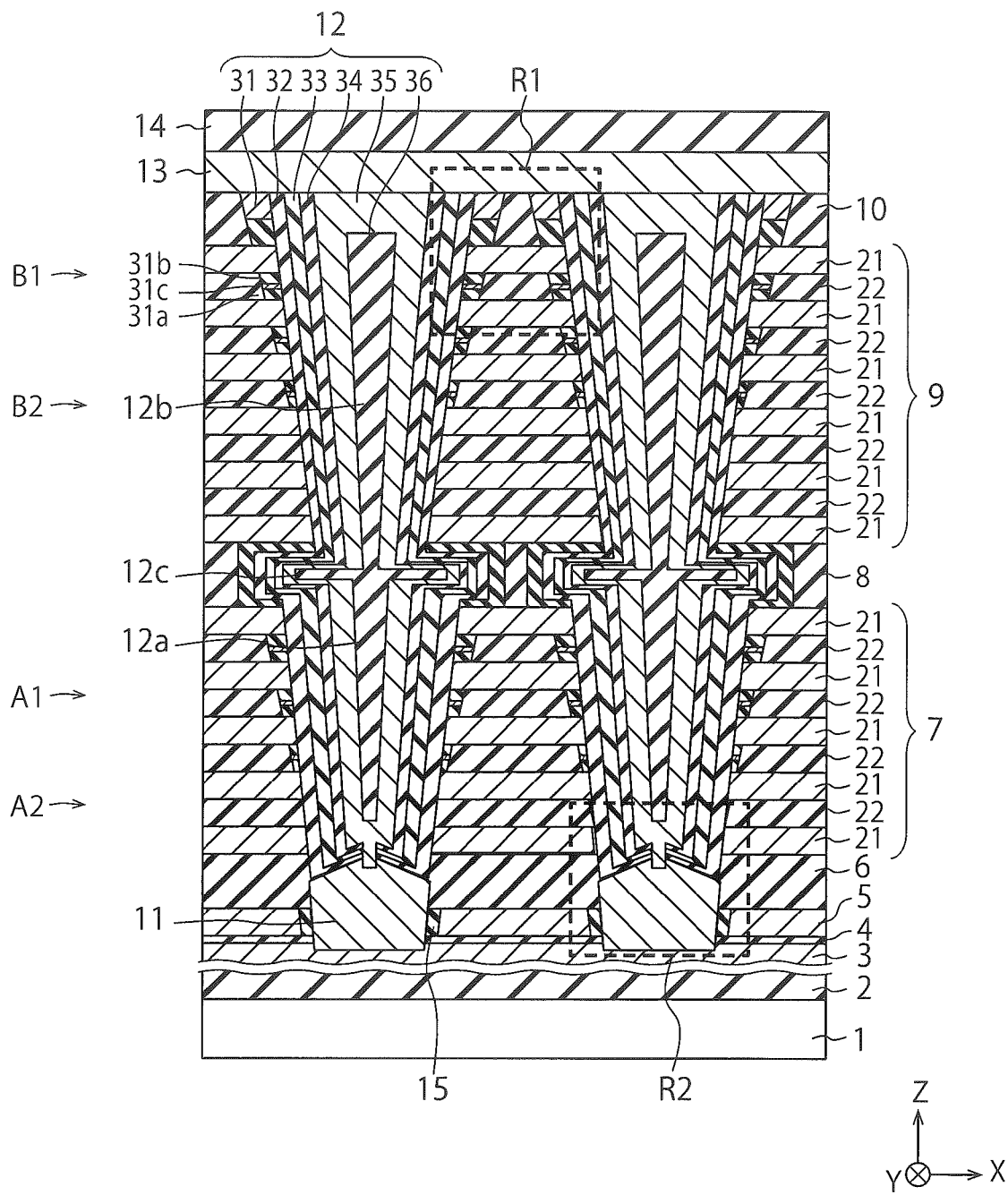
FIG. 9 is a cross-sectional view of a structure of a semiconductor device of a second embodiment.

FIG. 9 is a cross-sectional view of a structure of a semiconductor device of a second embodiment.

As illustrated in FIG. 9, the semiconductor device of the present embodiment includes components identical to those of the semiconductor device of the first embodiment. For example, like the columnar portions 12 of the first embodiment, the columnar portions 12 of the present embodiment each include the plurality of spacer films 31. However, the thicknesses of the spacer films 31 of the present embodiment vary according to the heights (Z coordinates) at which the spacer films 31 are disposed.

For example, the thicknesses (film thicknesses) of the respective spacer films 31 in the lower columnar section 12a become thinner as the heights at which the spacer films 31 are disposed become lower. Therefore, the thickness of the spacer film 31 in the lower columnar section 12a becomes thinner as the inner diameter of the spacer film 31 becomes smaller. For example, the spacer film 31 that is disposed at the top of the lower columnar section 12a has a thicker film thickness than the other spacer films 31 in the lower columnar section 12a, and has a larger inner diameter than the other spacer films 31 in the lower columnar section 12a. In the lower columnar section 12a of the present embodiment, the thickness of the spacer film 31 at a certain height becomes thinner as the height becomes lower, and further, becomes thinner as the inner diameter of the spacer film 31 at the height becomes smaller.

The same applies to the upper columnar section 12b. The thicknesses (film thicknesses) of the respective spacer films 31 in the upper columnar section 12b become thinner as the heights at which the spacer films 31 are disposed become lower. Therefore, the thickness of the spacer film 31 in the upper columnar section 12b becomes thinner as the inner diameter of the spacer film 31 becomes smaller. For example, the spacer film 31 that is disposed at the top of the upper columnar section 12b has a thicker film thickness than the other spacer films 31 in the upper columnar section 12b, and further, has a larger inner diameter than the other spacer films 31 in the upper columnar section 12b. In the upper columnar section 12b of the present embodiment, the thickness of the spacer film 31 at a certain height becomes thinner as the height becomes lower, and becomes thinner as the inner diameter of the spacer film 31 at the height becomes smaller.

In addition, the lower stacked film 7 of the present embodiment includes a region A1 where the spacer films 31 exist between the block insulator 32 and the insulating layers 22, and a region A2 where none of the spacer films 31 exist between the block insulator 32 and the insulating layers 22. The region A2 is positioned under the region A1. The region A1 is an example of the first region. The region A2 is an example of the second region.

The same applies to the upper columnar section 12b. The upper stacked film 9 of the present embodiment includes a region B1 where the spacer films 31 exist between the block insulator 32 and the insulating layers 22, and a region B2 where none of the spacer films 31 exist between the block insulator 32 and the insulating layers 22. The region B2 is positioned under the region B1. The region B1 is an example of the first region. The region B2 is an example of the second region.

According to the present embodiment, the difference in the memory hole diameter between the lower portion and the upper portion of each of the lower columnar sections 12a can be effectively reduced. That is, the block insulator 32, etc. can be formed into a shape the same as that in a case where the difference in the memory hole diameter is small. Accordingly, problems caused by the difference in the memory hole diameter can be prevented. The same applies to the upper columnar section 12b.

Figure 10A:
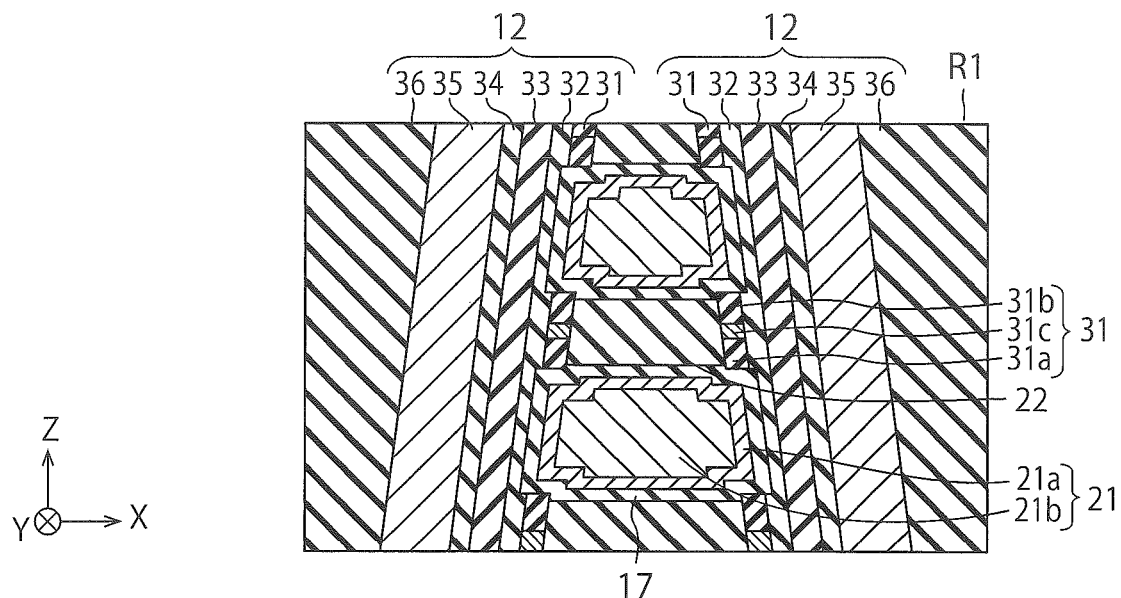
FIGS. 10A and 10B are enlarged cross-sectional views of the structure of the semiconductor device of the second embodiment.
Figure 10B:
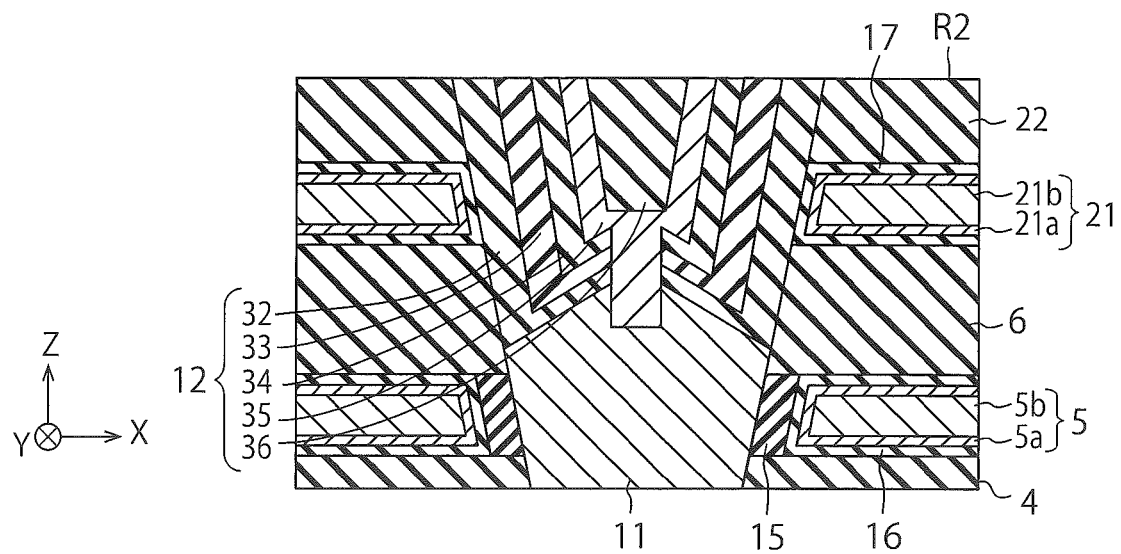

FIGS. 10A and 10B are enlarged cross-sectional views of the structure of the semiconductor device of the second embodiment. FIG. 10A illustrates the region R1 illustrated in FIG. 9 in an enlarged manner. FIG. 10B illustrates the region R2 illustrated in FIG. 9 in an enlarged manner.

As illustrated in FIG. 10B, the gate layer 5 of the present embodiment is formed, via the insulator 16, on the upper surface of the inter layer dielectric 4, on the lower surface of the inter layer dielectric 6, and on a side surface of the insulator 15. The gate layer 5 of the present embodiment includes the barrier metal layer 5a and the electrode material layer 5b formed in order on a surface of the insulator 16.

As illustrated in FIGS. 10A and 10B, the electrode layers 21 of the present embodiment are formed, via the insulator 17, on the upper surfaces of the insulating layers 22, etc., on the lower surfaces of the insulating layers 22, etc., and a side surface of the block insulator 32. Each of the electrode layers 21 of the present embodiment includes the barrier metal layer 21a and the electrode material layer 21b formed in order on a surface of the insulator 17.

FIG. 10A illustrates the insulator 31a, the insulator 31b, and the semiconductor layer 31c in each of the spacer films 31. As described later, each of the spacer films 31 of the present embodiment originally includes the semiconductor layer 31c only, and the insulators 31a, 31b are formed by oxidizing portions of the semiconductor layer 31c. In the present embodiment, while each of the spacer films 31 includes the semiconductor layer 31c only, the width, in the Z direction, of each of the spacer films 31 is substantially equal to the thickness (i.e., the width in the Z direction) of each of the insulating layers 22. However, the width, in the Z direction, of each of the spacer films 31 illustrated in FIG. 10A is larger than the thickness of each of the insulating layers 22 because each of the spacer films 31 expands upon oxidization of the semiconductor layer 31c. The width, in the Z direction, of each of the spacer films 31 is equivalent to the width, in the thickness direction of the insulating layers 22, of each of the spacer films 31.

FIGS. 11A to 13B are cross-sectional views of a method of manufacturing the semiconductor device of the second embodiment.

Figure 11B:
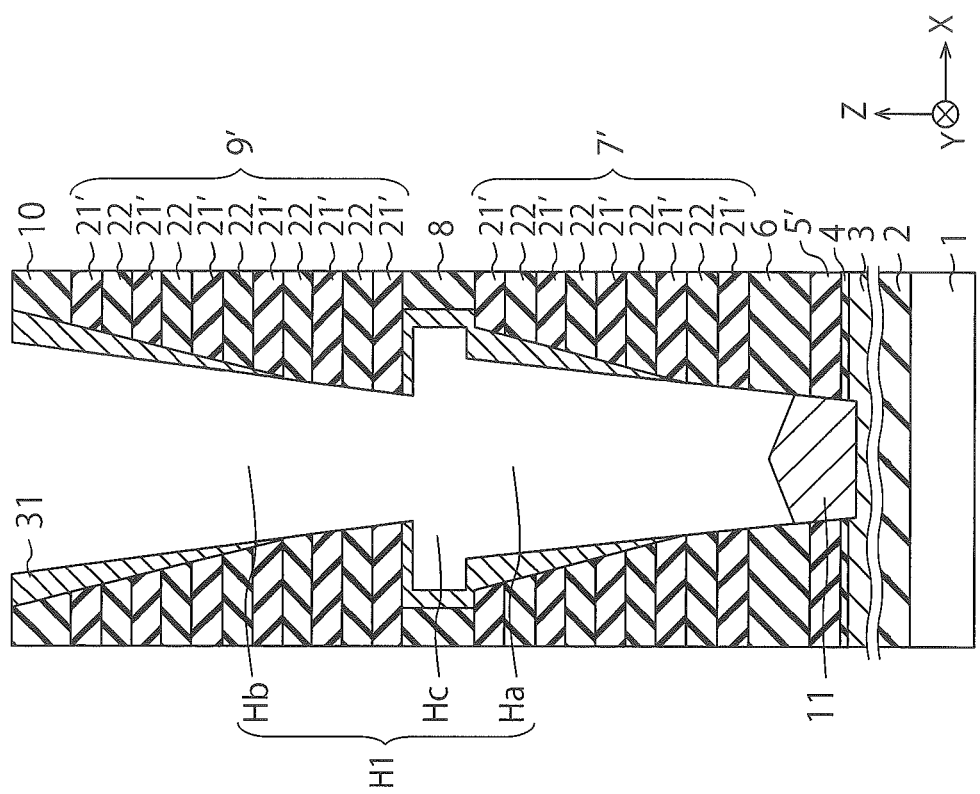
FIGS. 11A to 13B are cross-sectional views of a method of manufacturing the semiconductor device of the second embodiment.
Figure 11A:
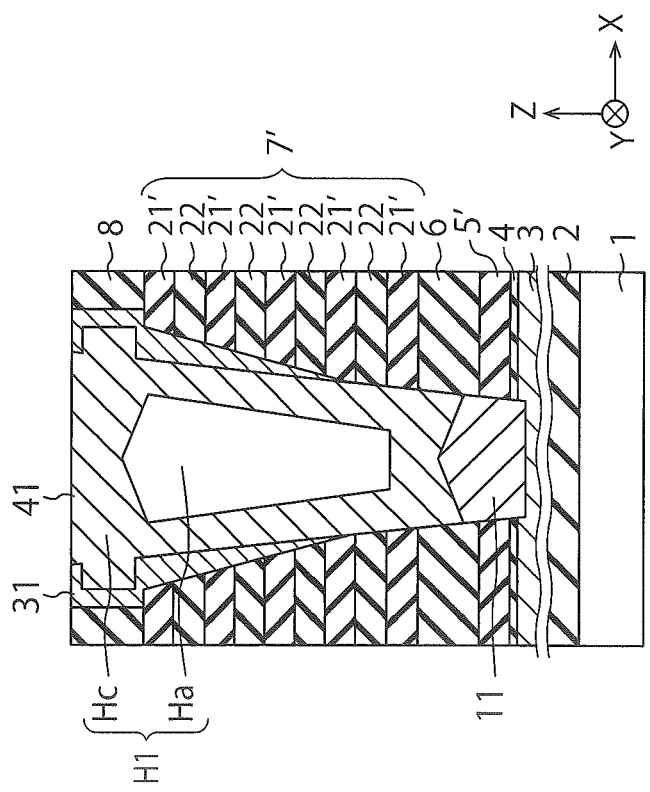

First, the inter layer dielectric 2, the source layer 3, the inter layer dielectric 4, the sacrifice layer 5', the inter layer dielectric 6, the lower stacked film 7', and the inter layer dielectric 8 are formed in order on the substrate 1 (FIG. 11A). The lower stacked film 7' is formed so as to alternately include the plurality of sacrifice layers 21' and the plurality of insulating layers 22.

Next, a plurality of portions of memory holes H1 are formed in the inter layer dielectric 8, the lower stacked film 7', the inter layer dielectric 6, the sacrifice layer 5', the inter layer dielectric 4, and the source layer 3 (FIG. 11A). FIG. 11A illustrates a state where the lower memory hole Ha and the intermediate open section Hc constituting one of the memory holes H1 are formed.

Next, the semiconductor layer 11 is formed in the bottom of each of the memory holes H1 (the lower memory holes Ha) (FIG. 11A). Accordingly, the semiconductor layer 11 is electrically connected to the source layer 3. Next, a portion of the spacer film 31 and a metal layer 41 are formed in order in each of the memory holes H1 (the lower memory holes Ha and the intermediate open sections Hc) (FIG. 11A). The spacer film 31 that is formed at the step in FIG. 11A is an amorphous silicon layer, and is not divided into portions corresponding to the insulating layers 22. The metal layer 41 is a stacked film including a TiN film and a W layer, for example. The metal layer 41 of the present embodiment is formed so as to fill the lower memory hole Ha and the intermediate open section Hc of each of the memory holes H1 together with an air gap.

Next, the upper stacked film 9' and the inter layer dielectric 10 are formed in order on the inter layer dielectric 8 and the metal layer 41 (FIG. 11B). The upper stacked film 9' is formed so as to alternately include the plurality of sacrifice layers 21' and the plurality of insulating layers 22.

Next, the other portions of the plurality of memory holes H1 are formed in the inter layer dielectric 10 and the upper stacked film 9' (FIG. 11B). FIG. 11B illustrates a state where the upper memory hole Hb constituting one of the memory holes H1 is further formed.

Next, the other portion of the spacer film 31 is formed in each of the memory holes H1 (upper memory holes Hb) (FIG. 11B). The spacer film 31 that is formed at the step in FIG. 11B is an amorphous silicon layer, and is not divided into portions corresponding to the insulating layers 22. Next, the metal layer 41 is removed from each of the memory holes H1 (FIG. 11B).

At the step in FIG. 11A, the spacer film 31 is formed such that the coverage is poor, for example. Accordingly, the film thickness of the spacer film 31 can be gradually decreased toward the −Z direction. Similarly, at the step in FIG. 11B, the spacer film 31 is formed such that the coverage is poor, for example. Accordingly, the film thickness of the spacer film 31 can be gradually decreased toward the −Z direction.

Figure 12A:
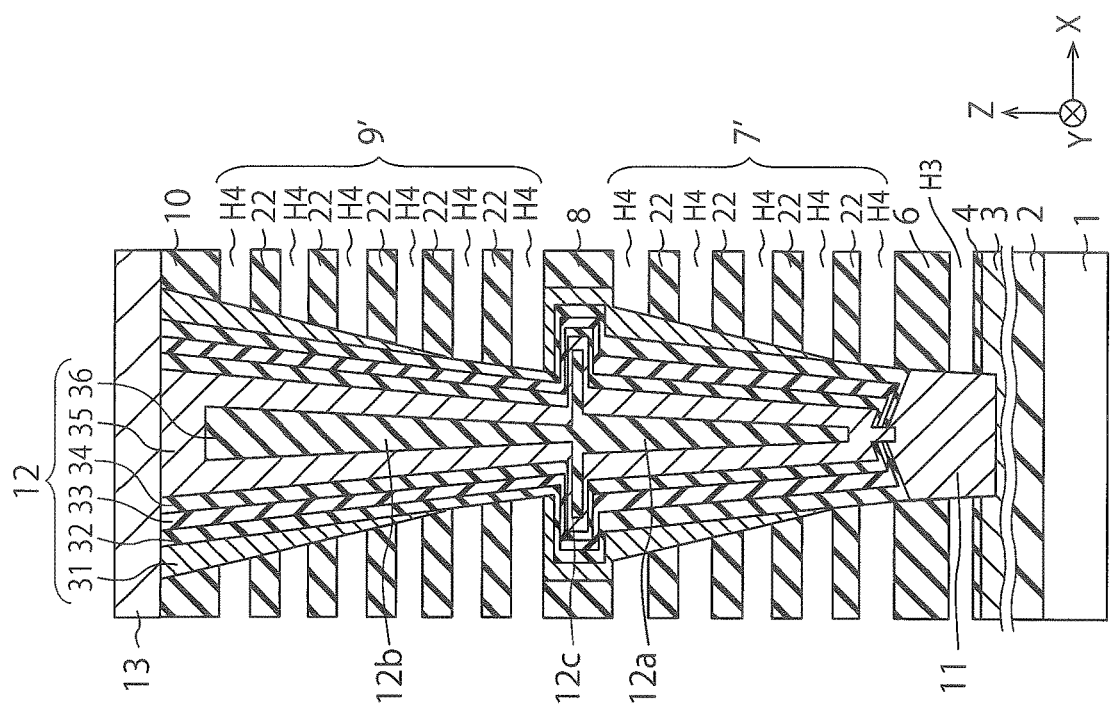

Next, the block insulator 32, the charge storage layer 33, the tunnel insulator 34, the channel semiconductor layer 35, and the core insulator 36 are formed in order in each of the memory holes H1 (FIG. 12A). The step in FIG. 12A is performed in the same manner as the steps in FIGS. 3B, 4A, and 4B. The channel semiconductor layer 35 that is formed at the step in FIG. 12A is an amorphous silicon layer, for example. In the aforementioned manner, the columnar portion 12 is formed in each of the memory holes H1. The channel semiconductor layer 35, etc. formed outside the memory hole H1 is removed by CMP. Next, the drain layer 13 is formed on the inter layer dielectric 10 and the columnar portion 12 (FIG. 12A).

In the present embodiment, after the channel semiconductor layer 35 is formed, crystallization annealing is performed on the channel semiconductor layer 35. Accordingly, the channel semiconductor layer 35, which is an amorphous silicon layer, is converted to a polysilicon layer. At the same time, the amorphous silicon layer in the spacer film 31 formed in the lower memory hole Ha and the upper memory hole Hb may also be converted to a polysilicon layer.

Figure 12B:
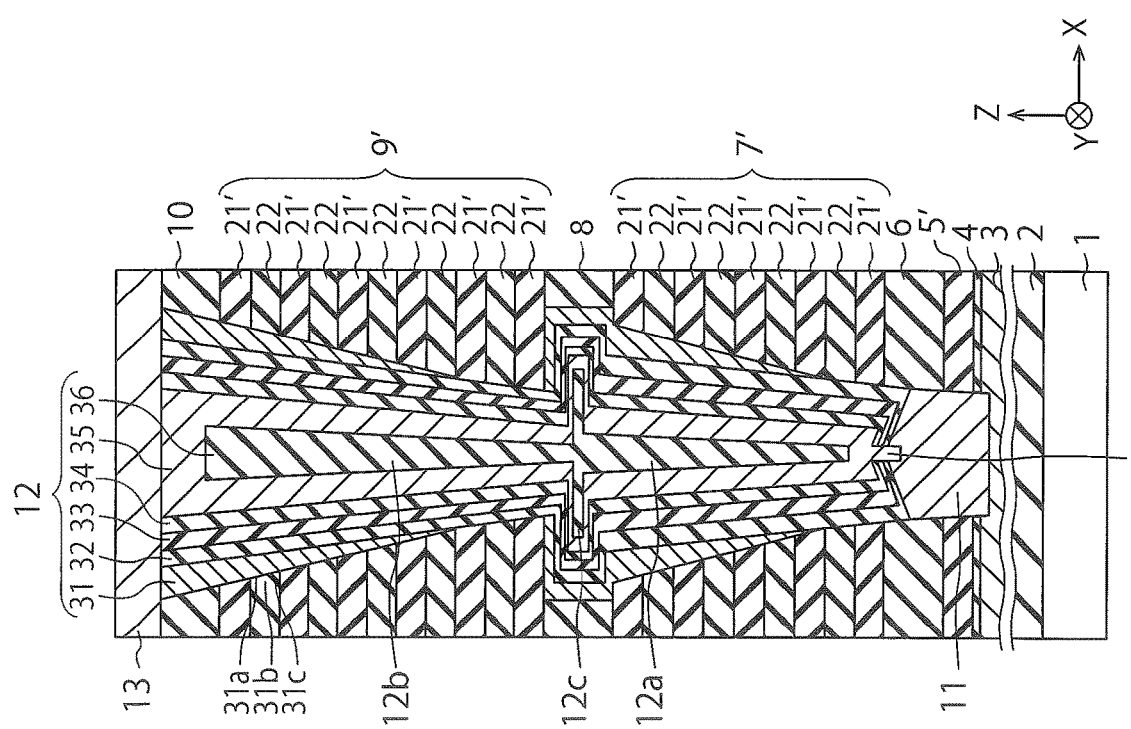

Next, a slit (not illustrated) passing through the drain layer 13, the inter layer dielectric 10, the upper stacked film 9', the inter layer dielectric 8, and the lower stacked film 7' is formed, and phosphoric acid is used to remove the sacrifice layers 5', 21' through the slit (FIG. 12B). As a result, the cavity H3 is formed in a region where the sacrifice layer 5' has been removed, and the plurality of cavities H4 are formed in a region where the plurality of sacrifice layers 21' have been removed.

Figure 13A:
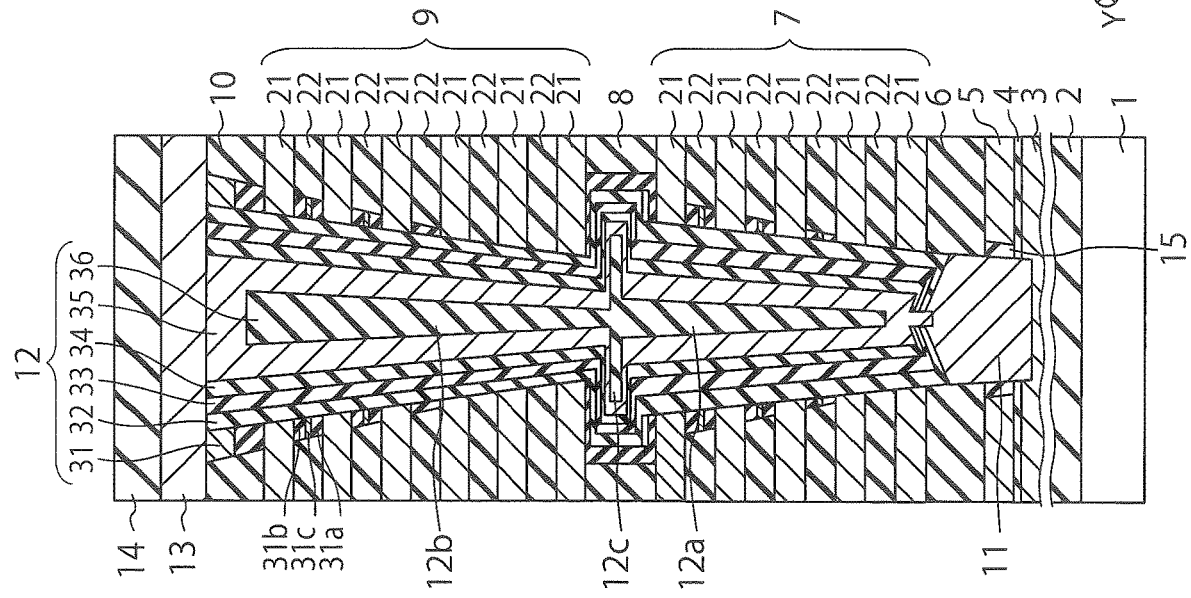

Next, phosphoric acid is used to remove portions of the spacer film 31 through the cavities H4 (FIG. 13A). Specifically, portions of the spacer film 31 located between the cavities H4 and the block insulator 32 are removed so that a side surface of the block insulator 32 is exposed from the cavities H4. As a result, the spacer film 31 is divided into portions corresponding to the insulating layers 22. FIG. 13A illustrates the plurality of the spacer films 31 remaining between the plurality of insulating layers 22 and the block insulator 32.

In FIG. 13A, the width, in the Z direction, of each of the spacer films 31 is substantially equal to the thickness (i.e., the width in the Z direction) of each of the insulating layers 22. The width, in the Z direction, of each of the spacer films 31 may become thinner than the thickness of each of the insulating layers 22 as a result of overetching of the spacer films 31 at the step in FIG. 13A.

Figure 13B:
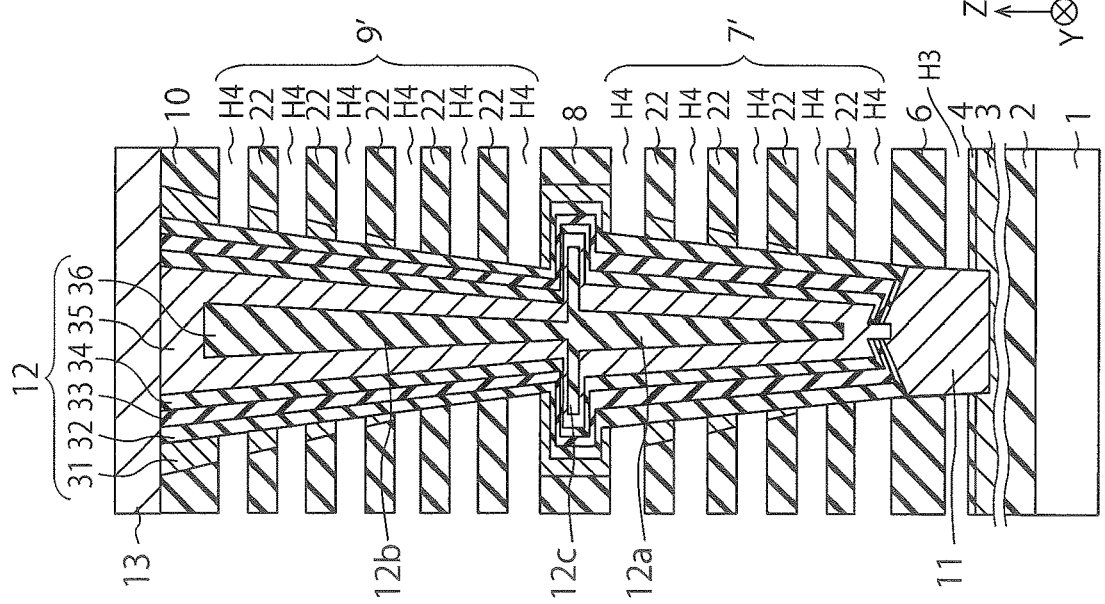

Next, surfaces (lower surfaces and upper surfaces) of the spacer films 31 are oxidized by use of the cavities H4 (FIG. 13B). As a result, the insulator 31a and the insulator 31b are respectively formed near the lower surface and near the upper surface of each of the spacer films 31, and the semiconductor layer 31c remains between the insulator 31a and the insulator 31b of each of the spacer films 31. The semiconductor layer 31c is an amorphous silicon layer or a polysilicon layer, for example. The insulators 31a, 31b are silicon oxide films, for example. In the present embodiment, as a result of oxidization of the surfaces of the spacer films 31, the width, in the Z direction, of each of the spacer films 31 becomes larger than the thickness of each of the insulating layers 22 (see FIG. 10A). Next, the insulator 15 is formed on a side surface of the semiconductor layer 11 in the cavity H3 (FIG. 13B).

Next, the insulator 16 (not illustrated) and the gate layer 5 are formed in order in the cavity H3, and the insulator 17 (not illustrated) and the electrode layer 21 are formed in order in each of the cavities H4 (FIG. 13B). As previously explained with reference to FIGS. 10A and 10B, the gate layer 5 is formed so as to include the barrier metal layer 5a and the electrode material layer 5b in order, and the electrode layers 21 are formed so as to each include the barrier metal layer 21a and the electrode material layer 21b in order. Accordingly, the lower stacked film 7 alternately including the plurality of electrode layers 21 and the plurality of insulating layers 22 is formed on the inter layer dielectric 6, and the upper stacked film 9 alternately including the plurality of electrode layers 21 and the plurality of insulating layers 22 is formed on the inter layer dielectric 8. Next, the inter layer dielectric 14 is formed on the drain layer 13 (FIG. 13B).

Thereafter, various plug layers, interconnect layers, inter layer dielectrics, etc. are formed on the substrate 1. In the manner explained so far, the semiconductor device of the present embodiment is manufactured.

As described so far, in the present embodiment, the block insulator 32 is formed in each of the memory holes H1 via the spacer films 31. Consequently, according to the present embodiment, problems caused by the shapes of the memory holes H1, such as the aforementioned problems of the resistance, a failure in degassing, a void, etc. can be prevented. In addition, according to the present embodiment, the spacer films 31 having varying film thicknesses are formed so that variation of the diameters of the memory holes H1 can be effectively prevented.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
a stacked film alternately including a plurality of electrode layers and a plurality of insulating layers;
a first insulator, a charge storage layer, a second insulator and a first semiconductor layer that are disposed in order in the stacked film; and
a plurality of first films disposed between the first insulator and the plurality of insulating layers,
wherein at least one of the first films includes a second semiconductor layer.

2. The device of claim 1, wherein the at least one of the first films includes a third insulator disposed under the second semiconductor layer, and/or a fourth insulator disposed on the second semiconductor layer.

3. The device of claim 2, wherein the third insulator is an oxide film, and/or the fourth insulator is an oxide film.

4. The device of claim 2, wherein
the second semiconductor layer includes silicon, and
the third insulator and/or the fourth insulator includes silicon and oxygen.

5. The device of claim 1, wherein the first films have annular shapes to surround the first insulator.

6. The device of claim 1, wherein a width of the first films in a thickness direction of the insulating layers is larger than a thickness of the insulating layers.

7. The device of claim 1, further comprising:
a first interconnect layer disposed above the stacked film;
a second interconnect layer disposed below the stacked film;
a third interconnect layer disposed below the second interconnect layer; and
a third semiconductor layer disposed on the third interconnect layer and in the second interconnect layer,
wherein the first semiconductor layer is electrically connected to the first interconnect layer, and is electrically connected to the third interconnect layer via the third semiconductor layer.

8. The device of claim 7, wherein the first interconnect layer is a drain layer, the second interconnect layer is a gate layer, and the third interconnect layer is a source layer.

9. The device of claim 7, wherein the third semiconductor layer is disposed in the second interconnect layer via a fifth insulator.

10. The device of claim 1, wherein a thickness of the first films at a certain height becomes thinner as the height becomes lower.

11. The device of claim 1, wherein
the first films have annular shapes to surround the first insulator, and
a thickness of the first films at a certain height becomes thinner as an inner diameter of the first films at the height becomes smaller.

12. The device of claim 1, wherein the stacked film includes:
a first region where the first films exist between the first insulator and the insulating layers; and
a second region where none of the first films exist between the first insulator and the insulating layers, the second region being positioned under the first region.

* * * * *